(12) United States Patent
Eussen (10) Patent No.: US 7,242,454 B1
(45) Date of Patent: Jul. 10, 2007

(54) LITHOGRAPHIC APPARATUS, AND APPARATUS AND METHOD FOR MEASURING AN OBJECT POSITION IN A MEDIUM

(75) Inventor: Emiel Jozef Melanie Eussen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/319,194

(22) Filed: Dec. 28, 2005

(51) Int. Cl.
*G03B 27/52* (2006.01)
*G03B 27/42* (2006.01)

(52) U.S. Cl. .......................................... 355/30; 355/53
(58) Field of Classification Search ................ 355/30, 355/53, 72–76; 356/399–401, 500; 250/548
See application file for complete search history.

(56) References Cited

U.S. PATENT DOCUMENTS 4,153,341 A * 5/1979 Kawamura et al. ......... 359/824
5,610,683 A * 3/1997 Takahashi .................... 355/53

* cited by examiner

*Primary Examiner*—Henry Hung Nguyen
(74) *Attorney, Agent, or Firm*—Pillsbury Winthrop Shaw Pittman, LLP

(57) ABSTRACT

A lithographic apparatus has a position measuring apparatus configured to measure a position of a substrate support or a patterning support in a medium. The position measuring apparatus has a barometer to measure a pressure of the medium, thereby providing a pressure signal. The position measuring apparatus has a distance measuring device measuring a reference distance, thereby providing a reference distance signal. The position measuring apparatus has a processor that converts the reference distance signal into a pressure-change signal; processes the pressure-change signal in a similar way as the pressure signal, thereby providing a processed pressure-change signal; determines a difference between the processed pressure-change signal and the pressure signal, thereby providing a drift signal; determines a difference between the pressure-change signal and the drift signal, thereby providing an absolute pressure signal; and corrects a position measurement on the basis of the absolute pressure signal.

9 Claims, 4 Drawing Sheets

LITHOGRAPHIC APPARATUS, AND APPARATUS AND METHOD FOR MEASURING AN OBJECT POSITION IN A MEDIUM

BACKGROUND

1. Field of the Invention

The present invention relates to a lithographic apparatus, and an apparatus and method for measuring a position of an object in a medium.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The patterning device may be held on a movable patterning support (also referred to as a reticle stage), and the substrate may be held on a movable substrate support (also referred to as a wafer stage). The patterning support and the substrate support each are moved by one or more motors that are accurately controlled by a positioning system. To enable control of the patterning support and the substrate support with a high accuracy, typically in the order of nanometers, the positioning system includes a laser interferometer system to determine a position of an object very accurately.

In a laser interferometer system, which is an incremental system where the wavelength of the laser light used constitutes a measurement unit, a reflection of a laser beam against a reflecting surface of the object is measured and compared with an internal reference path. If the object position changes in line with the laser beam, the comparison between the reference and the measuring laser beam will show a number of interference transitions (consisting of constructive/destructive interference between the measuring path and the reference path) which is proportional to the displacement. The number of interference transitions is not only proportional to the displacement, but also with the wavelength of the laser light. More particularly, the total amount of interference transitions is equal to the total optical path divided by the wavelength (in that optical path) at the end of the displacement minus the total optical path divided by the wavelength at the start of the displacement. When the total optical path at the end of the displacement is regarded as a sum of a constant optical path (=the total optical path at the start of the displacement) and a displacement optical path, then the total amount of interference transitions includes the displacement optical path divided by the latest wavelength and the constant optical path divided by a changed wavelength (the constant optical path divided by the wavelength at the end of the displacement minus the constant optical path divided by the wavelength at the start of the displacement (see also formula [4] below)).

The wavelength of light in air depends on the nominal wavelength in vacuum, divided by the refractive index of the medium through which the light travels. The refractive index in air $n_{air}$ may be described by the so-called Edlen formula (B. Edlen, The Refractive Index of Air, Metrologia, Vol. 2, No. 2, pp. 71–80 (1966)).

Another version of the Edlen formula, in which the basic interdependencies of the parameters are unchanged, is described in K. P. Birch, M. J. Downs, 1994, Correction of the updated Edlen equation for the refractive index of air, Metrologia 31, pp. 315–316 (included herein by reference).

$$n_{air} - 1 = \frac{D \cdot P}{96095.43} \cdot \frac{1 + 10^{-8}(0.601 - 0.00972 \cdot (T - 273.15)) \cdot P}{1 + 0.0036610 \cdot (T - 273.15)} - f \cdot 3.63442 \cdot 10^{-10} \quad [1]$$

which is valid for $\lambda = 633$ nm and concentration $CO_2 = 450$ ppm, and wherein:

$D = 2.7653 \cdot 10^{-4}$

T=absolute temperature [K]

P=pressure [Pa]

f=humidity [Pa]

It will be appreciated that $n_{air}$, according to formula [1], depends on the pressure of the air as well as on other parameters. In view of the above, when measuring a position with a laser interferometer system, it is desirable to at least take into account the pressure of the air. When the pressure is accurately known, the refractive index may be accurately determined. Further, the number of interference transitions (also termed "fringe count") may be accurately determined in the laser interferometer system. Combining the results of the pressure determination and the fringe count, the position sought may be accurately and repeatably determined.

Generally, it results from the foregoing discussion that, in order to accurately measure an object displacement in a medium, such as air, using a laser interferometer system or any other measurement system based on the determination of a number of wavelengths, it is desirable to accurately determine the pressure of the medium.

A pressure is measured by a barometer, preferably an absolute barometer. On the one hand, a barometer may be capable of a continuous pressure measurement. On the other hand, a barometer may be an electronic barometer, having a limited update rate in the order of tens of Hz in view of the averaging time needed for the required accuracy. For different kinds of barometers, account has to be taken of a certain measurement delay which for electronic barometers may include half an averaging time, and overhead introduced by the measurement system. This introduces errors in the measurements of pressure changes, which results in errors in the position measurements based on laser interferometer position information, which position measurements in themselves are sensitive to pressure changes.

A disturbance leading to a relatively rapid, possibly periodic pressure change may cause an error which cannot be followed by the barometer.

One might seek to overcome this problem by compensating a (patterning or substrate) support position measurement using a reference measurement, such as a measurement of the position of an optical component (e.g., a lens). In the compensation process, a reference distance is compared with an actual distance corresponding to a support position, assuming a good correlation between the refractive index of both optical paths. However, since the actual distance may differ substantially from the reference distance, the performance of the compensation process will degrade when the difference between the actual distance and the reference distance increases.

Further, it is to be noted that the mechanical components (e.g., a metrology frame, a lens) supporting parts of the laser interferometer system will show resonances, and show dimensional drift when temperature changes. Such effects may also deteriorate the accuracy of a measurement of a support position or displacement, if no compensation takes place.

SUMMARY

It is desirable to provide a correction method for laser interferometer measurements, specifically and effectively compensating these measurements for pressure changes, independent of temperature changes and mechanical changes.

In an embodiment of the invention, a lithographic apparatus is provided, including: an illumination system configured to condition a radiation beam; a patterning support constructed to support a patterning device, the patterning device being capable of imparting the radiation beam with a pattern in its cross-section to form a patterned radiation beam; a substrate support constructed to hold a substrate; a projection system configured to project the patterned radiation beam onto a target portion of the substrate; a position measuring apparatus configured to measure a position of one of the supports in a medium, the position measuring apparatus including: a barometer configured to measure a pressure of the medium, thereby providing a pressure signal; a distance measuring device measuring a reference distance, thereby providing a reference distance signal; and a processor configured to: (c1) convert the reference distance signal into a pressure-change signal; (c2) process the pressure-change signal in a similar way as the pressure signal, thereby providing a processed pressure-change signal; (c3) determine a difference between the processed pressure-change signal and the pressure signal, thereby providing a drift signal; (c4) determine a difference between the pressure-change signal and the drift signal, thereby providing an absolute pressure signal; and (c5) correct a position measurement on the basis of the absolute pressure signal.

In an embodiment of the invention, an apparatus for measuring a position of an object in a medium is provided, the apparatus including: a barometer configured to measure a pressure of the medium, thereby providing a pressure signal; a distance measuring device measuring a reference distance, thereby providing a reference distance signal; and a processor configured to: (c1) convert the reference distance signal into a pressure-change signal; (c2) process the pressure-change signal in a similar way as the pressure signal, thereby providing a processed pressure-change signal; (c3) determine a difference between the processed pressure-change signal and the pressure signal, thereby providing a drift signal; (c4) determine a difference between the pressure-change signal and the drift signal, thereby providing an absolute pressure signal; and (c5) correct a position measurement on the basis of the absolute pressure signal.

In an embodiment of the invention, a method for measuring a position of an object in a medium is provided, the method including: measuring a pressure of the medium, thereby providing a pressure signal; measuring a reference distance, thereby providing a reference distance signal; converting the reference distance signal into a pressure-change signal; processing the pressure-change signal in a similar way as the pressure signal, thereby providing a processed pressure-change signal, determining a difference between the processed pressure-change signal and the pressure signal, thereby providing a drift signal; determining a difference between the pressure-change signal and the drift signal, thereby providing an absolute pressure signal; and correcting a position measurement on the basis of the absolute pressure signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
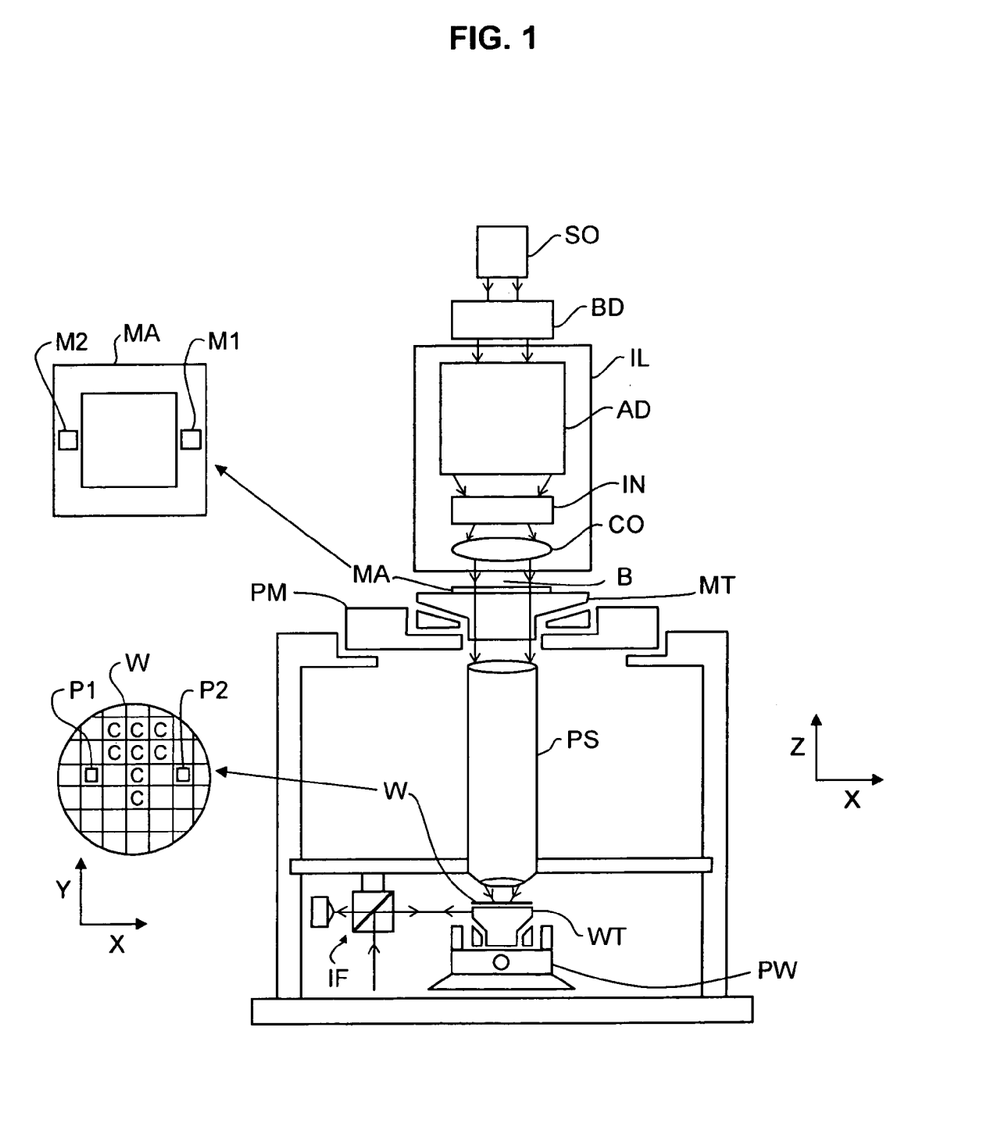
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

The lithographic apparatus as described with reference to FIG. 1 may include a laser interferometer system to measure the positions of the mask table MT and the substrate table WT. Also, a reference measurement is made. As an example, in the reference measurement a displacement of the lens of the projection system PS with respect to the interferometer system is measured. Since the lens is mechanically connected via a stable metrology frame to the interferometer system, the actual displacements are very small.

Figure 2:
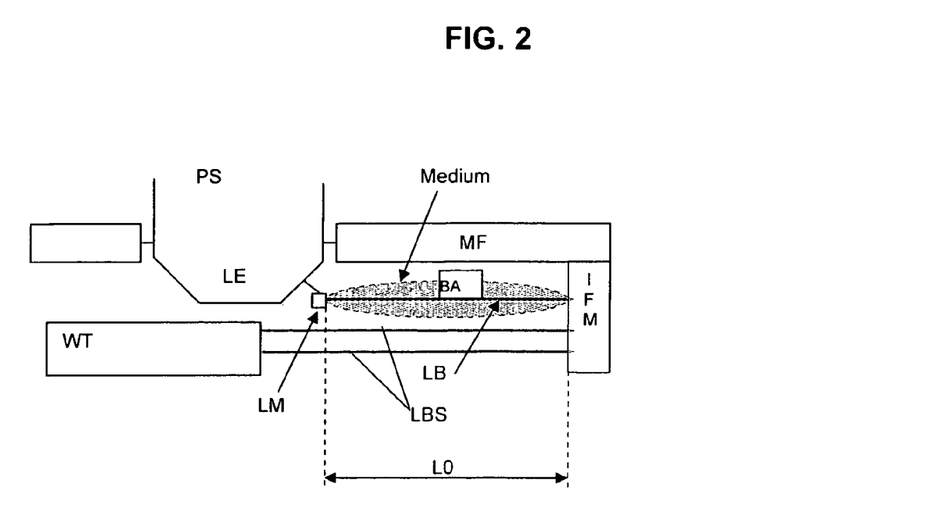
FIG. 2 schematically illustrates a part of a lithographic apparatus, a laser interferometer system performing a reference distance measurement and another distance measurement.

FIG. 2 depicts an arrangement of components to obtain a reference measurement. A metrology frame MF of a lithographic apparatus supports a laser interferometer system IFM and the projection system PS. A position of a lens LE of the projection system PS is measured through a laser beam LB of the laser interferometer system IFM reflected by a lens mirror LM connected to the lens LE. The laser interferometer system IFM also generates other laser beams LBS to measure, e.g., a position of a substrate table WT. The nominal optical path length (mechanical distance) of the reference measurement LB is indicated as L0.

In FIG. 2, the laser interferometer system reference measurement is mainly affected by changes of position of the lens mirror LM with respect to the laser interferometer system, and also by pressure changes in the medium present in the path of the laser beams of the laser interferometer system. The mechanical components supporting the laser interferometer system, such as the metrology frame MF, the lens LE and the lens mirror LM will show resonances, which may be at 90~100 Hz and higher. This is much higher than the expected rate of change of the pressure changes, and such resonances may be filtered out of the measurement using a low-pass or notch filter. Changes of the mechanical components affecting the laser interferometer system measurements at the low side of the frequency spectrum, are experienced as a result of temperature effects (drift having a frequency of, e.g., 2 Hz or lower).

At a certain moment in time, t, an interferometer output Fc can be expressed as $$Fc = \frac{L0_t}{\lambda_t} + \text{offset} \qquad [2]$$

wherein:

Fc fringe-count, the number of fringe-lengths (units) that fit in the distance measured $L0_t$ 'mechanical' distance measured $\lambda_t$ fringe-length, the measurement unit of the interferometer system, determined by the wavelength of the laser light in air offset after initialization, Fc will be equal to 0, since in practice the interferometer system can only measure relative changes. However to deal with changes in the wavelength (refractive index), an offset is introduced during initialization that equals minus $L0/\lambda$ at that time.

If the output Fc at a moment t=t is compared with the output Fc at a 'reference' moment t=0, then:

$$\Delta Fc(t) = \frac{L0_t}{\lambda_t} - \frac{L0_0}{\lambda_0} \qquad [3]$$

or $$\Delta Fc(t) = \frac{L0_0 + \Delta L0(t)}{\lambda_0 + \Delta\lambda(t)} - \frac{L0_0}{\lambda_0} \qquad [4]$$

wherein:

$\Delta L0(t)$ change in (mechanical) distance with respect to $L0_o$ at t=t $\Delta\lambda(t)$ change in wavelength with respect to $\lambda_0$, at t=t If the Edlen formula [1] is translated to the wavelength change in formula [4] and only pressure and temperature effects are taken into account, then $$\Delta Fc(t) = \frac{L0_0 + \Delta L0(t)}{\lambda_0 + \frac{d\lambda}{dn}\Delta n(t)} - \frac{L0_0}{\lambda_0} \qquad [5]$$

or $$\Delta Fc(t) = \frac{L0_0 + \Delta L0(t)}{\lambda_0 + \frac{d\lambda}{dn}\left(\frac{\partial n}{\partial P}\bigg|_{T=T_0}\Delta P(t) + \frac{\partial n}{\partial T}\bigg|_{T=T_0, P=P_0}\Delta T(t)\right)} - \frac{L0_0}{\lambda_0} \qquad [6]$$

In formula [6]

$$\frac{d\lambda}{dn} \text{ may be written as}: -\frac{\lambda_0}{n_0}$$

and $$\frac{\partial n}{\partial P}\big|_{T=T_0} \text{ may be rewritten as: } c_1 \approx 2.67 \cdot 10^{-9}\big|_{T=22degC.}$$

and $$\frac{\partial n}{\partial T}\big|_{T=T_0, P=P_0} \text{ may be rewritten as: } c_2 \approx -9 \cdot 10^{-7}\big|_{T=22degC., P=10^5 Pa}$$

Thus, formula [6] can be rewritten as:

$$\Delta Fc(t) = \frac{L0_0 + \Delta L0(t)}{\lambda_0 \cdot \left[1 - \frac{c_1}{n_0} \cdot \Delta P(t) - \frac{c_2}{n_0} \cdot \Delta T(t)\right]} - \frac{L0_0}{\lambda_0} \quad [7]$$

If $\Delta P(t)$ is isolated:

$$\Delta P(t) = -\frac{n_0 \cdot \left[1 + \frac{1}{\Delta Fc(t) \cdot \lambda_0} \cdot \Delta L0(t) + \left[\frac{1}{\Delta Fc(t) \cdot \lambda_0} + 1\right] \cdot \frac{c_2}{n_0} \cdot \Delta T(t)\right]}{c_1 \cdot \left[\frac{L0_0}{\Delta Fc(t) \cdot \lambda_0} + 1\right]} \quad [8]$$

If the mechanical components supporting the laser interferometer system IFM and the temperature are assumed stable, then $\Delta L0(t)$ and $\Delta T(t)$ are zero, and formula [8] can be reduced to:

$$\Delta P(t) = \frac{-n_0 \cdot \Delta Fc(t)}{c_1 \cdot \left[\frac{L0_0}{\lambda_0} + \Delta Fc(t)\right]} \quad [9]$$

Since the expected absolute pressure change within 5 minutes is expected to be less than 80 Pa and the constants at t=0 ($n_0$, $c_1$, $L0_o$ and $\lambda_o$) are all known accurate within <<1 ppm, the accuracy of this pressure derivation is <<0.1 Pa.

As shown in formula [8], the calculated $\Delta P(t)$ will be disturbed by the change in actual distance measured $\Delta L0(t)$ and temperature effects. If the dynamical behaviour of the mechanical components supporting the laser interferometer system IFM is filtered out via a low pass or notch filter on the fringe counts (where the mechanical frequencies are assumed to be much higher than the frequency of pressure changes), only low frequency disturbances of the interferometer system measurements will remain.

To correct for the low frequency disturbance (drift), an absolute pressure sensor or barometer BA (FIG. 2) is used to "calibrate" the pressure calculation. Since the absolute pressure sensor BA may only be needed to correct for low frequency drift, the update rate of the absolute pressure sensor BA can be set at a low level (e.g., less than 10 Hz) to achieve a low noise level.

To calculate a drift correction, the calculated $\Delta P(t)$ may be processed the same as the pressure sensor does. This is to say that the calculated $\Delta P(t)$ is processed with the same sampling time, delay and possible filtering as the pressure sensor is used. Then, as a new sample of the absolute pressure sensor becomes available, the (relative) drift can be determined and virtually immediately corrected for. This is explained in more detail below with reference to FIGS. 4A–4D.

As a result, the pressure changes of the medium in the laser interferometer system can be measured up to frequencies determined by the lowpass or notch filter. A delay can be very small and is determined by the low pass or notch filter. The filter can be optimized to reduce the delay in a way which is within the reach of a skilled person, e.g., by increasing a cut-off frequency and using a notch filter to deal with first frequencies, etc.

A benefit of this solution is that all required hardware may be already available, and only a software modification needs to be made.

Figure 3:
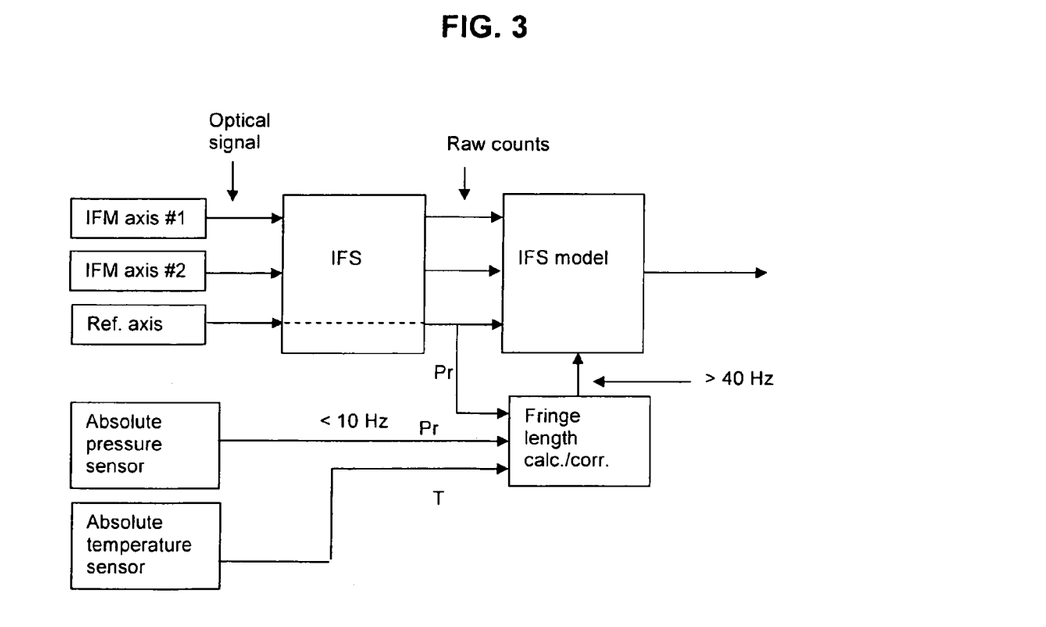
FIG. 3 is a block diagram illustrating part of position measuring apparatus according to an embodiment of the present invention.

FIG. 3 schematically shows a laser interferometer system having several measurement axes IFM axis #1, IFM axis #2, . . . , and a reference axis, such as the reference axis explained by reference to FIG. 2. Optical signals produced by the different axes are input to, and processed in a programmed interferometer system IFS which produces raw fringe counts. The raw fringe counts are input to an interferometer system (IFS) model calculating positions or distances from the fringe counts. A fringe length is input to the interferometer model system from a fringe length calculation/correction module at a relatively high frequency (e.g., ca. 40 Hz or higher), basically close to the cut-off frequency of the above-mentioned lowpass or notch filter. As inputs, the fringe length calculation module receives signals from an absolute pressure sensor at a relatively low frequency (e.g., lower than 10 Hz), from an absolute temperature sensor, and from the reference axis.

FIGS. 4A–4D further illustrate the measuring method according to embodiments of the present invention. The vertical axes of the graphs shown represent a pressure Pr, and the horizontal axes represent time t.

Figure 4A:
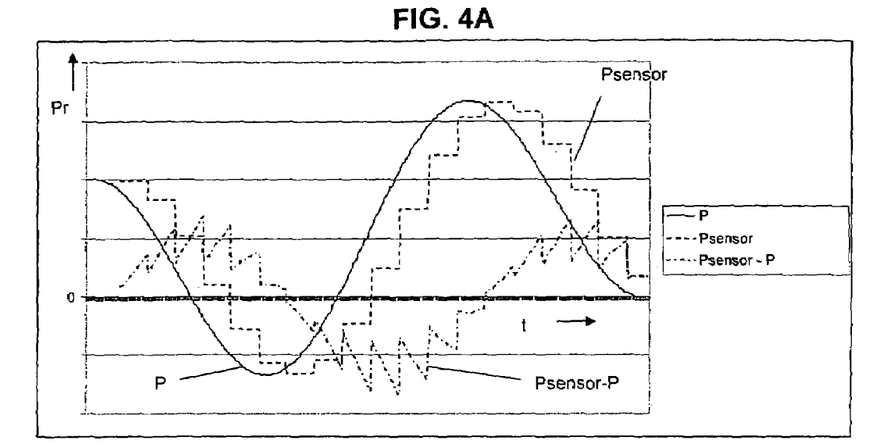
FIGS. 4A–4D show graphs of measuring signals and signals derived therefrom.

FIG. 4A shows different curves of measuring signals versus time. A curve P represents by way of example a pressure change over a predetermined period of time (e.g., one minute). A curve Psensor represents an output signal of an absolute pressure sensor (e.g., at a 20 Hz update rate). At the start of each new update, a delay is half the sampling time (e.g., 25 ms) plus an additional delay (e.g., ca. 10 ms) due to various overhead of the measuring system. A curve Psensor-P represents a difference (measurement error) between the output signal of the pressure sensor Psensor and the pressure P.

Figure 4B:
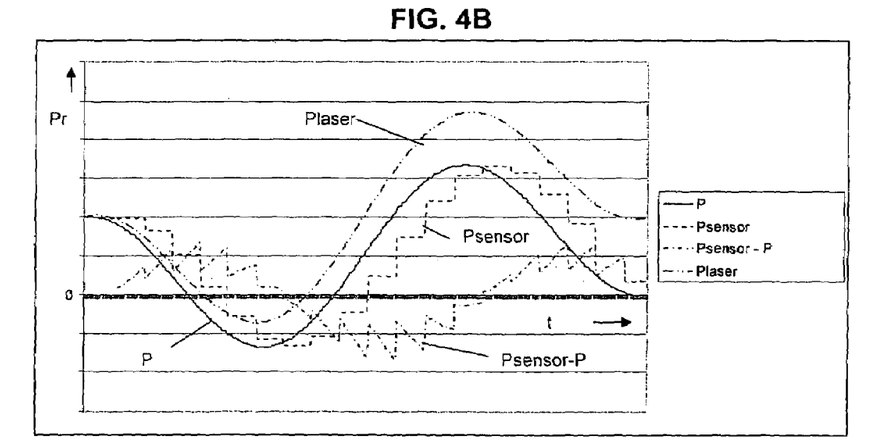

FIG. 4B, drawn on a slightly different vertical scale, shows the curves P, Psensor, and Psensor-P according to FIG. 4A. A curve representing a pressure signal Plaser derived from an interferometer axis according to formula [9] above has been added. Note that any high frequency noise has been filtered out. As can be seen in FIG. 4B, the curve Plaser does not show a delay error (contrary to the output signal of the absolute pressure sensor, curve Psensor), but shows a relatively slow drift which may be caused by thermal effects affecting mechanical components defining the length of the interferometer axis (such as the metrology frame).

Figure 4C:
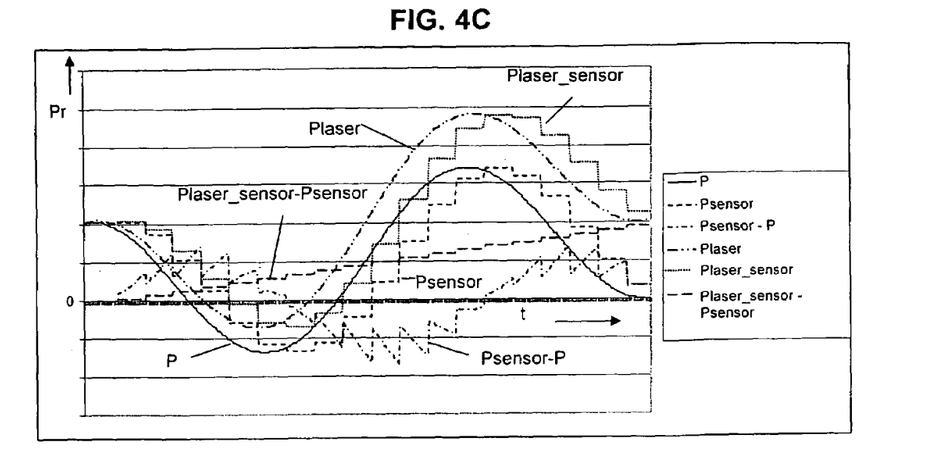

FIG. 4C illustrates the situation that the pressure signal Plaser is processed similarly as the actual pressure P, where the drift is made visible. In the figure, a curve Plaser_sensor represents the pressure Plaser derived from the interferometer axis, processed in a similar way as the absolute pressure sensor. Now the difference between the sensor output signal Psensor and the simulated sensor output Plaser_sensor is a measure for the drift in the pressure signal Plaser. This is represented by a curve Plaser_sensor-Psensor.

Figure 4D:
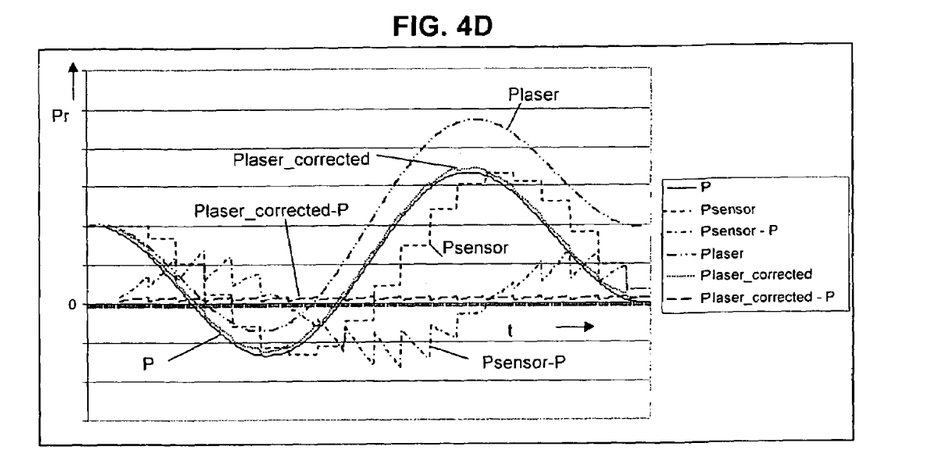

FIG. 4D illustrates the results of correcting the pressure Plaser by the offset between the curves Psensor and Plaser_sensor, indicated as Plaser_corrected. It appears that the pressure Plaser_corrected is very close to the actual pressure P. A small residual error shown in curve Plaser_corrected-P remains.

Generally speaking, the effect of data delay in the pressure sensor is transferred from the high frequency changes, which are critical, to low frequency changes (drift), which are not critical.

It follows from this above disclosure that the invention also would apply to a pressure change compensation in a low-cost wavelength tracker incorporating a laser interferometer system and a reference axis which is not particularly stable, and shows considerable drift. It will be appreciated that other parameters than pressure are not compensated for, and are assumed to be either known or constant.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an," as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a patterning support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate;
   a position measuring apparatus configured to measure a position of one of said supports in a medium, the position measuring apparatus comprising:
   (a) a barometer configured to measure a pressure of the medium and to provide a pressure signal;
   (b) a distance measuring device configured to measure a reference distance and to provide a reference distance signal; and
   (c) a processor configured to:
      (c1) convert the reference distance signal into a pressure-change signal;
      (c2) process the pressure-change signal in a similar way as the pressure signal and to provide a processed pressure-change signal;
      (c3) determine a difference between the processed pressure-change signal and the pressure signal to provide a drift signal;
      (c4) determine a difference between the pressure-change signal and the drift signal to provide an absolute pressure signal; and
      (c5) correct a position measurement based on the absolute pressure signal.

2. The lithographic apparatus of claim 1, wherein the distance measuring device is a laser interferometer system.

3. The lithographic apparatus of claim 1, wherein the processor is further configured to filter high frequencies from the pressure-change signal.

4. The lithographic apparatus of claim 2, wherein in step (c1) the conversion includes applying the formula $$\Delta P(t) = \frac{-n_0 \cdot \Delta Fc(t)}{c_1 \cdot \left[\frac{LO_0}{\lambda_0} + \Delta Fc(t)\right]}$$

in which:

| | |
|---|---|
| $\Delta P(t)$ | pressure change signal |
| $n_0, c_1$ | constants |
| $\Delta Fc(t)$ | change in fringe count of the laser interferometer system |
| $LO_0$ | reference distance |
| $\lambda_0$ | wavelength |

5. The lithographic apparatus of claim 1, wherein the pressure signal includes a delay, and in step (c2) said delay is introduced in the pressure-change signal to provide the processed pressure-change signal.

6. The lithographic apparatus of claim 1, wherein the barometer is sampled, and in step (c2) the pressure-change signal is equally sampled to provide the processed pressure-change signal.

7. The lithographic apparatus of claim 6, wherein the barometer is sampled with a sampling frequency less than 10 Hz.

8. An apparatus for measuring a position of an object in a medium, the apparatus comprising:
   (a) a barometer configured to measure a pressure of the medium and to provide a pressure signal;
   (b) a distance measuring device configured to measure a reference distance and to provide a reference distance signal; and
   (c) a processor configured to:
      (c1) convert the reference distance signal into a pressure-change signal;
      (c2) process the pressure-change signal in a similar way as the pressure signal and to provide a processed pressure-change signal;
      (c3) determine a difference between the processed pressure-change signal and the pressure signal to provide a drift signal;
      (c4) determine a difference between the pressure-change signal and the drift signal to provide an absolute pressure signal; and
      (c5) correct a position measurement based on the absolute pressure signal.

9. A method for measuring a position of an object in a medium, the method comprising:
   (a) measuring a pressure of the medium to provide a pressure signal;
   (b) measuring a reference distance to provide a reference distance signal;
   (c) converting the reference distance signal into a pressure-change signal;
   (d) processing the pressure-change signal in a similar way as the pressure signal to provide a processed pressure-change signal,
   (e) determining a difference between the processed pressure-change signal and the pressure signal to provide a drift signal;
   (f) determining a difference between the pressure-change signal and the drift signal to provide an absolute pressure signal; and
   (g) correcting a position measurement based on the absolute pressure signal.

* * * * *